United States Patent
Lee et al.

(10) Patent No.: US 7,338,910 B2
(45) Date of Patent: Mar. 4, 2008

(54) METHOD OF FABRICATING SEMICONDUCTOR DEVICES AND METHOD OF REMOVING A SPACER

(75) Inventors: Chung-Ju Lee, Hsin-Chu Hsien (TW); Chih-Ning Wu, Hsin-Chu (TW); Wei-Tsun Shiau, Kao-Hsiung Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 112 days.

(21) Appl. No.: 11/162,952

(22) Filed: Sep. 29, 2005

(65) Prior Publication Data
US 2007/0072402 A1   Mar. 29, 2007

(51) Int. Cl.
H01L 21/302    (2006.01)
H01L 21/461    (2006.01)

(52) U.S. Cl. .................. 438/745; 438/687; 438/757; 257/E21.251

(58) Field of Classification Search ........ 438/745, 438/757, 687
See application file for complete search history.

(56) References Cited

U.S. PATENT DOCUMENTS

2005/0253204 A1* 11/2005 Chan et al. ............... 257/412
2006/0046401 A1*  3/2006 Kavalieros et al. ....... 438/283

* cited by examiner

Primary Examiner—Alexander Ghyka
(74) Attorney, Agent, or Firm—Winston Hsu

(57) ABSTRACT

A method of fabricating a semiconductor device is disclosed. The method includes defining an electrode on a semiconductor substrate; forming a spacer on at least one sidewall of the electrode; performing a process operation on the semiconductor substrate using the spacer as a mask and forming a material layer on the top or the surface of the semiconductor substrate and the electrode; and removing the spacer by steps of performing a wet etching process at a temperature in a range of 100° C. to 150° C. to etch the spacer using an acid solution containing phosphoric acid as an etchant. With respect to another aspect, a method of removing a spacer is also disclosed. The method includes performing a wet etching process at a temperature in a range of 100° C. to 150° C. to etch the spacer using an acid solution containing phosphoric acid as an etchant.

18 Claims, 9 Drawing Sheets

Performing a wet etching process
using a phosphoric acid etchant at ~100
160 °C for removal of SiN spacers

Fig. 2  Prior art

METHOD OF FABRICATING SEMICONDUCTOR DEVICES AND METHOD OF REMOVING A SPACER

BACKGROUND OF THE INVENTION

1. Field of the Invention

The present invention relates to semiconductor fabrication, particularly to a method for removing spacers in semiconductor fabrication.

2. Description of the Prior Art

Semiconductor device geometries have dramatically decreased in size since such devices were first introduced several decades ago. Today's fabrication plants are producing devices having 0.35 µm, 90 nm, and even 65 nm feature sizes or smaller. As geometries shrink, semiconductor manufacturing methods often need to be improved.

Conventional MOS (metal-oxide-semiconductor) device fabrication utilizes a technique of building material spacers to help control and define the implantation of dopants in the source and drain regions of the MOS. A conventional NMOS semiconductor device is schematically illustrated in FIG. 1. The conventional NMOS transistor device 10 generally includes a semiconductor substrate generally comprising a silicon layer 16 having a source 18 and a drain 20 separated by a channel region 22. Ordinarily, the source 18 and drain 20 further border a shallow-junction source extension 17 and a shallow-junction drain extension 19, respectively. A thin oxide layer 14 separates a gate 12, generally comprising polysilicon, from the channel region 22. The source 18 and drain 20 are $N^+$ regions having been doped by arsenic, antimony or phosphorous. The channel region 22 is generally boron doped. A silicon nitride spacer 32 is formed on sidewalls of the gate 12. A liner 30, generally comprising silicon dioxide, is interposed between the gate 12 and the silicon nitride spacer 32. A salicide layer 42 is selectively formed on the exposed silicon surface of the device 10. The process known as self-aligned silicide (salicide) process has been widely utilized to fabricate metal silicide materials, in which a source/drain region is first formed, a metal layer comprised of cobalt, titanium, or nickel is disposed on the source/drain region and the gate structure, and a rapid thermal process (RTP) is performed to react the metal layer with the silicon contained within the gate structure and the source/drain region to form a metal silicide for reducing the sheet resistance of the source/drain region.

In the conventional MOS fabrication technique, spacers are often used in the fabrication of LDD (lightly doped drain) regions to facilitate the different levels of doping for the drain/source regions and the LDD regions. The LDD region can be controlled by the lateral spacer dimension and the thermal drive cycle, and can be independent from the source and drain implant depth. In the 65 nm technology and beyond, the channel mobility enhancement can be further achieved by deposition of a highly strained dielectric layer after spacer removal. However, removing the spacer, especially spacer SiN (silicon nitride), is critical because removal can damage adjacent structures, such as the metal silicide layer, the gate, and the underlying silicon substrate.

Conventionally, the spacer SiN is removed using a hot $H_3PO_4$ process at a temperature of 160° C., as the step 100 shows in FIG. 2. This often leads to the erosion of NiSi substrate and NiSi polycide in the PMOS and NMOS regions. While, at low temperatures, phosphoric acid is unable to significantly etch the silicon nitride, higher temperatures speed up the attack of the silicon oxide, but decrease the etch rate of the silicon nitride. As a result, it has been difficult to etch a silicon nitride structure using phosphoric acid.

Therefore, there is a need for a better method to remove spacers and not damage salicide layers.

SUMMARY OF THE INVENTION

An objective of the present invention is to provide a method of fabricating a semiconductor device and a method of removing a spacer for removal of spacers without damage to adjacent structures.

According to the present invention, the method of fabricating a semiconductor device comprises defining an electrode on a semiconductor substrate, forming a spacer on at least one sidewall of the electrode, performing a process operation on the semiconductor substrate using the spacer as a mask and forming a material layer on the top or the surface of the semiconductor substrate and the electrode, and removing the spacer by steps of performing a wet etching process at a first temperature in a range of 100° C. to 150° C. to etch the spacer using an acid solution containing phosphoric acid as an etchant.

According to the present invention, the method of removing a spacer comprises steps of providing a substrate comprising an electrode, a spacer on at least one sidewall of the electrode, and a material layer on the top or the surface of the substrate and the electrode; and performing a wet etching process at a first temperature in a range of 100° C. to 150° C. to etch the spacer using an acid solution containing phosphoric acid as an etchant.

In one embodiment according to the present invention, the acid solution containing phosphoric acid is subjected to a pretreatment before the use as an etchant. It is subjected to a silicide seasoning at a second temperature to reach a saturation point for the use as an etchant. Alternatively, after reaching a saturation point, the acid solution containing phosphoric acid is further allowed to stand for a period of time at a third temperature, and then used for etching.

In the present invention, removal of spacers is accomplished by a wet etching process using an acid solution containing phosphoric acid as an etchant at relatively low temperatures. The acid solution containing phosphoric acid is subjected to a pretreatment, such that it can etch spacers and does not damage salicide layers.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings:

FIG. 2 shows a step for removing SiN spacers in a conventional technique;

DETAILED DESCRIPTION

Please refer to FIGS. 3-6. FIGS. 3-6 are schematic cross-sectional diagrams illustrating a method of fabricating semiconductor MOS transistor device 10 in accordance with one preferred embodiment of the present invention, wherein like number numerals designate similar or the same parts, regions or elements. It is to be understood that the drawings are not drawn to scale and are served only for illustration purposes.

Figure 1:
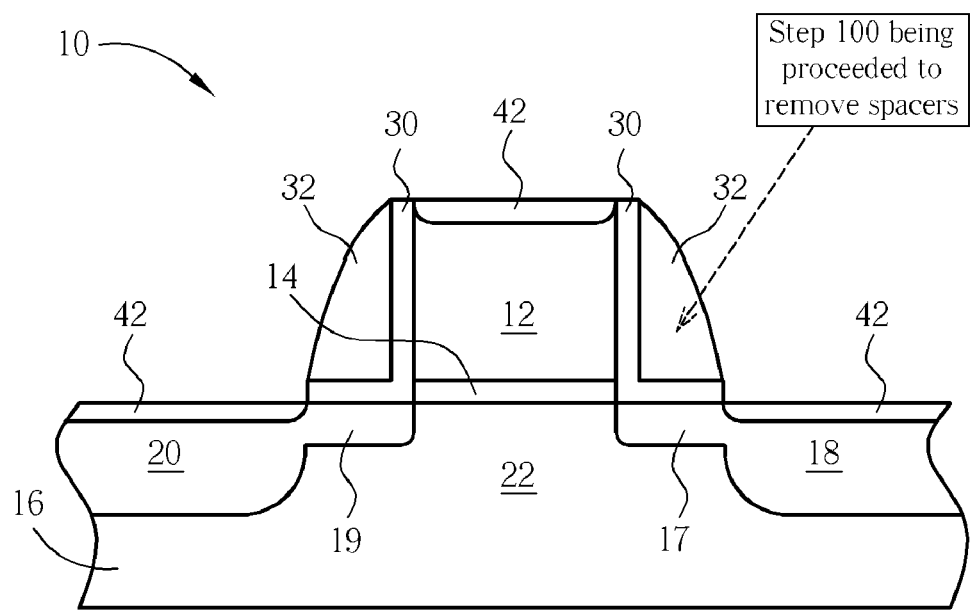
FIG. 1 is schematic cross-sectional diagrams illustrating a conventional semiconductor MOS transistor device.
Figure 3:
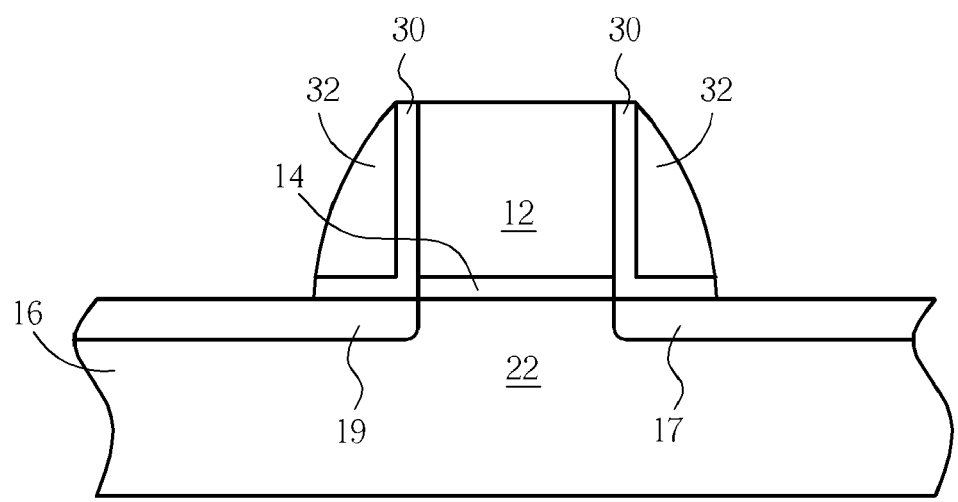
FIGS. 3-6 are schematic cross-sectional diagrams illustrating a method of fabricating semiconductor MOS transistor devices in accordance with one preferred embodiment of the present invention.

The present invention pertains to a method of fabricating MOS transistor devices, such as NMOS, PMOS, and CMOS devices of integrated circuits. As shown in FIG. 3, a semiconductor substrate generally comprising a silicon layer 16 is prepared. According to this invention, the semiconductor substrate may be a silicon substrate or a silicon-on-insulator (SOI) substrate, but not limited thereto. An electrode, such as a gate electrode 12, is defined on the semiconductor substrate. A shallow-junction source extension 17 and a shallow-junction drain extension 19 may be formed in the silicon layer 16. The source extension 17 and the drain extension 19 are separated by a channel 22.

A thin oxide layer 14 may be formed to separate the gate electrode 12 from the channel 22. The gate 12 generally comprises polysilicon. The oxide layer 14 may be made of silicon dioxide. However, in another case, the oxide layer 14 may be made of high-k materials known in the art. Subsequently, a silicon nitride spacer 32 is formed on sidewalls of the gates 12. A liner 30, such as silicon dioxide, may be interposed between the silicon nitride spacer 32 and the gate electrode 12. The liners 30 are typically L shaped and have a thickness of about 30-120 angstroms. The liner 30 may further comprise an offset spacer that is known in the art and is thus omitted in the drawings.

Figure 4:
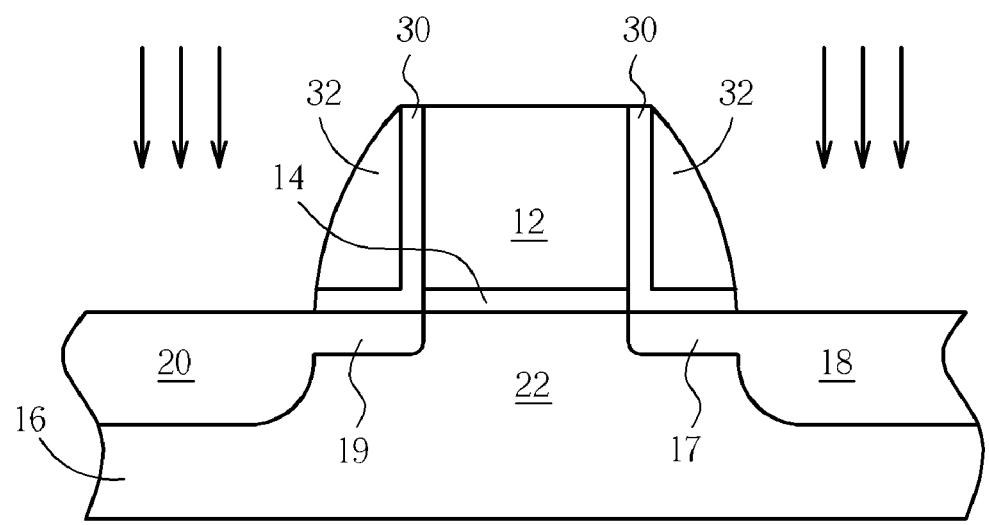

As shown in FIG. 4, after forming the silicon nitride spacer 32, a source region 18 and a drain region 20 may be further formed in the semiconductor substrate by an ion implantation process carried out by doping dopant species, such as N type dopant species (such as arsenic, antimony or phosphorous) for making an NMOS or P type dopant species (such as boron) for making a PMOS, into the silicon layer 16. After the source/drain doping, the substrate may be subjected to an annealing and/or activation thermal process that is known in the art.

Figure 5:
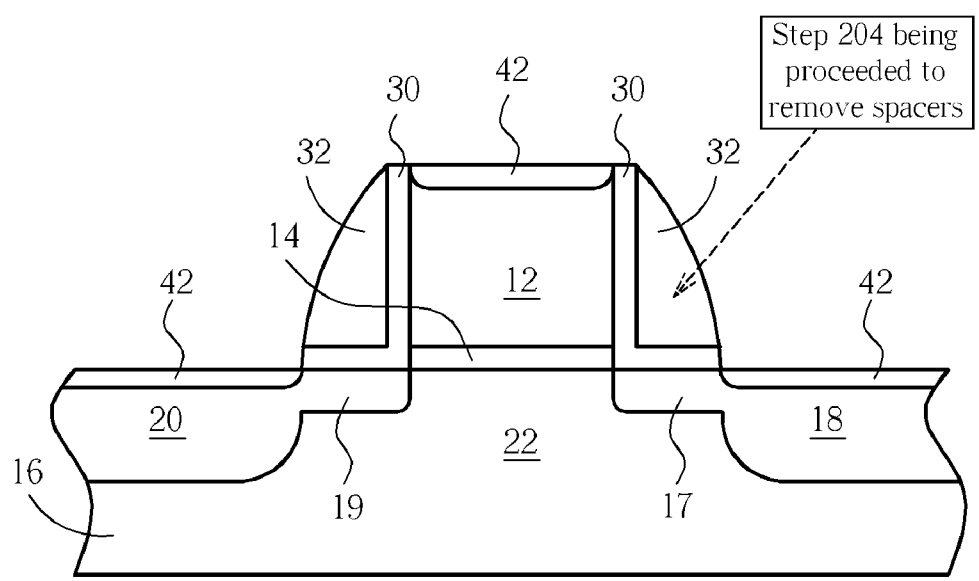

As shown in FIG. 5, a layer, such as a salicide layer 42, is formed on the gate electrode 12, on the exposed source region 18 and on the exposed drain region 20. The salicide layer 42 may be formed using the process known as self-aligned silicide (salicide) process, in which, after a source/drain region is formed, a metal layer comprising nickel is disposed on the source/drain region and the gate structure, and a rapid thermal process (RTP) is performed to react the metal layer with the silicon contained within the gate structure and the source/drain region to form a metal silicide. The temperature for RTP may be in the range of 700° C. to 1000° C.

Figure 6:
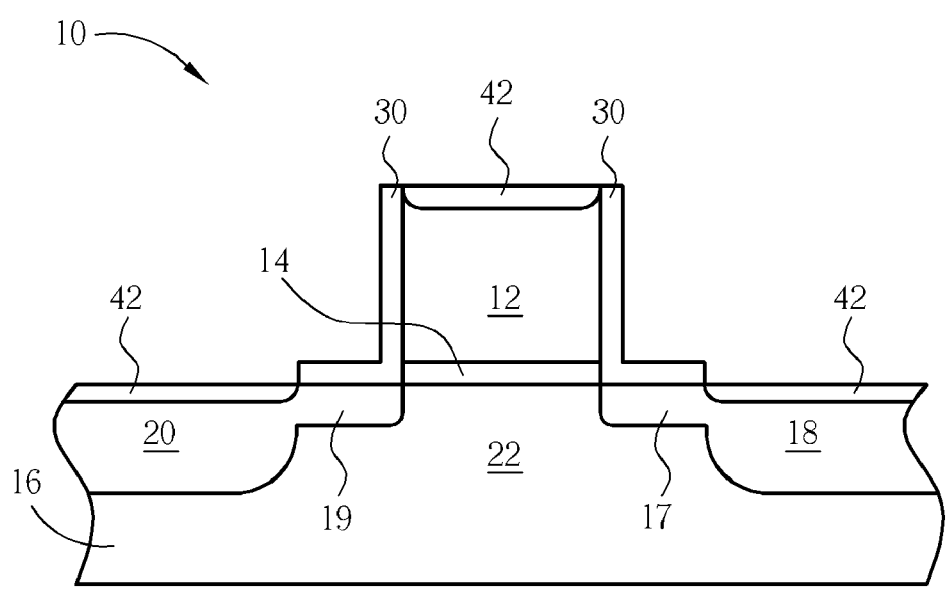

Subsequently, as shown in FIG. 6, the silicon nitride spacer 32 is stripped away, leaving the liner 30 on the sidewalls intact. In the present invention, the silicon nitride spacer 32 is removed by a wet etching process, while the salicide layer 42 is not damaged by the etching. According to one embodiment, an acid solution containing phosphoric acid at a temperature in the range of 100 to 150° C., preferably at 140° C., is used as an etchant to remove the silicon nitride spacer 32. The acid solution containing phosphoric acid may contain any concentration of phosphoric acid in water, provided the acid solution exhibits an etching ability to spacers. Preferably, the phosphoric acid concentration ranges from about 50 to about 100% depending on etching temperatures, and is more preferably 79.5% when the etching temperature is set at 140° C. The acid solution may optionally contain additional agents, such as buffering agents and/or other acids like fluoboric acid and sulfuric acid. For effectively removing spacers using the acid solution containing phosphoric acid as an etchant at 150° C. or lower, the acid solution containing phosphoric acid needs a pretreatment before use.

Figure 7:
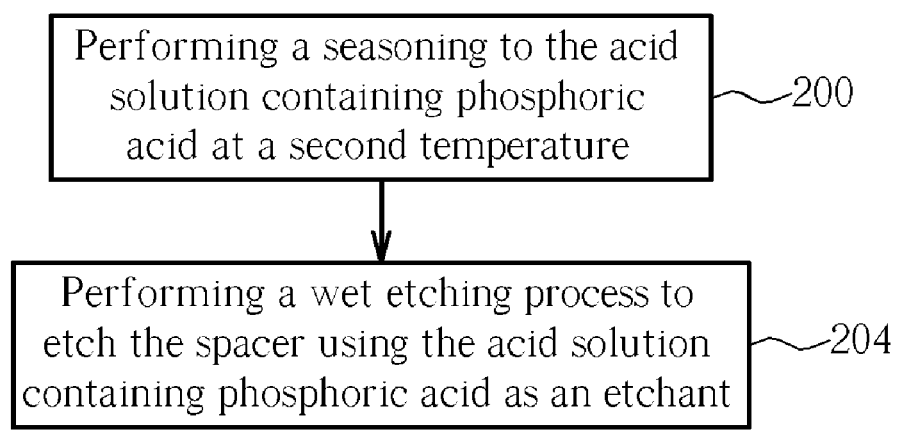
FIG. 7 is a flow chart showing the etchant pretreatment in one embodiment according to the present invention.
Figure 8:
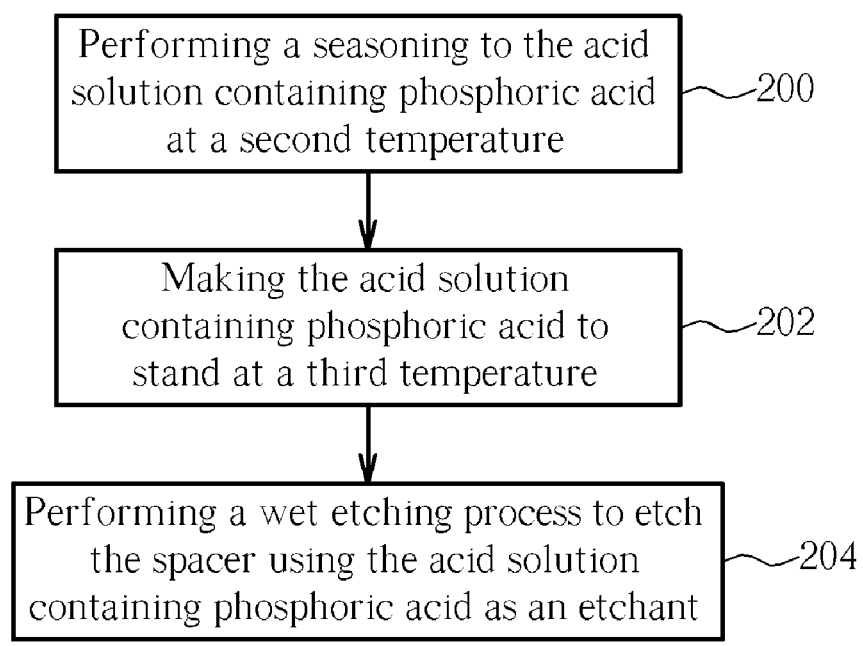
FIG. 8 is a flow chart showing the etchant pretreatment in another embodiment according to the present invention.

Please refer to FIG. 7 showing pretreatment steps for the acid solution containing phosphoric acid. As shown in the step 200, the acid solution containing phosphoric acid is subjected to a silicide seasoning at a second temperature to reach a saturation point. The "saturation point" of the acid solution containing phosphoric acid herein is referred to a point when nickel silicide film is no longer etched by the acid solution containing phosphoric acid after the acid solution containing phosphoric acid is subjected to the silicide seasoning for a period of time. The second temperature may be, for example, in the range of 100° C. to 180° C., and preferably 160° C. After the saturation point is reached, the resulting acid solution containing phosphoric acid may be provided as an etchant directly in a step 204 of a wet etching process for spacers, or further subjected to a step 202 as shown in FIG. 8 before being used as an etchant in a wet etching process for spacers. In the step 202, the resulting acid solution containing phosphoric acid is allowed to stand still for a period of time at a third temperature. The third temperature is in the range of 100° C. to 150° C., and preferably 140° C. After standing, the acid solution containing phosphoric acid reaches an azeotropic point and is stable at the third temperature, which may be the first temperature used in the wet etching process. Hereafter, the step 204 is performed to provide the acid solution containing phosphoric acid as an etchant for the wet etching process. The etchant has an excellent etching selectivity of the SiN spacer over the salicide layer. Accordingly, the SiN spacer is easily etched away and the salicide layer is not damaged.

The seasoning aforementioned may be accomplished by dipping one or a plurality of dummy wafers having a silicide layer on the surface in the acid solution containing phosphoric acid, but is not limited to this. Any method which allows a silicide to be dissolved in the acid solution containing phosphoric acid can be used. The silicide may be, but is not limited to, for example, silicon nitride.

Figure 9:
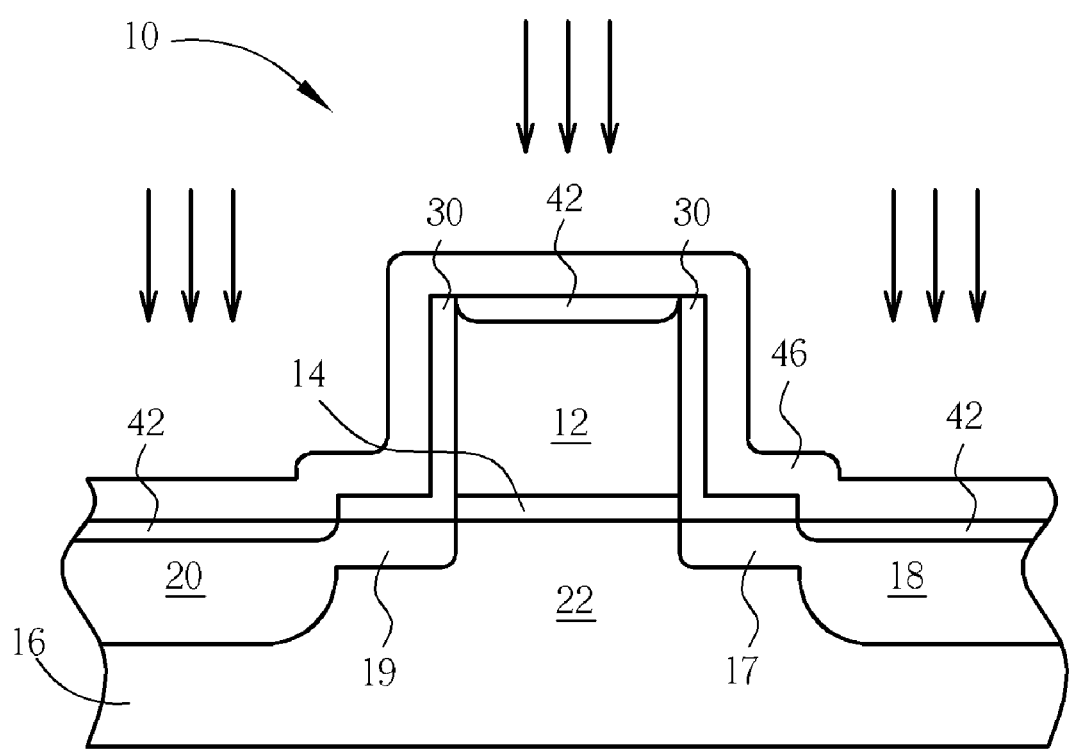
FIG. 9 shows a further semiconductor process after the removal of spacers according to the present invention.

As shown in FIG. 6, after removing the silicon nitride spacer 32, approximately L shaped liners are left. However, this invention is not limited to an L shaped liner and the liner may be etched to be thinner or etched away as desired. The thickness of the liner may be between about 0 and 500 angstroms. The resulting substrate may be subsequently processed after the spacers are removed as desired in the strained silicon technique or other semiconductor manufacturing processes. As shown in FIG. 9, a conformal silicon nitride cap layer 46 is further deposited on the substrate. Preferably, the silicon nitride cap layer 46 has a thickness of about 30 to 2000 angstroms. The silicon nitride cap layer 46 borders the liner 30 on the sidewalls of the gate 12 of the transistor device 10. The silicon nitride cap layer 46 may be deposited in a compressive-stressed status (for example, −0.1 Gpa to −3 Gpa) for an NMOS or in a tensile-stressed status (for example, 0.1 Gpa to 3 Gpa) for a PMOS to render the channel region 22 a tensile stress or a compressive stress. The alteration of the stress status of the exposed silicon nitride cap layer 46 may be accomplished by using a germanium ion implantation or by using other methods known to those skilled in the art.

The example describes the pretreatment of the acid solution containing phosphoric acid in the present invention, and the comparison example is for purpose of comparison only.

EXAMPLE 1

An acid solution containing phosphoric acid having a $H_3PO_4$ concentration of 79.5% in an etching tank was heated at 160° C. Fifty dummy wafers having a SiN layer deposited on the surface were placed into the acid solution containing phosphoric acid to perform a seasoning. A dummy wafer having a NiSi film deposited on the surface was used to determine whether the acid solution containing phosphoric acid is saturated. When the acid solution containing phosphoric acid no longer etches the NiSi layer, it is deemed to have reached a saturation point. The temperature of the acid solution containing phosphoric acid was reduced to 140° C. and allowed to stand for 48 hours. Thereafter, the resulting acid solution containing phosphoric acid was provided to be an etchant for removing SiN spacers on a semiconductor substrate at 140° C. The semiconductor further had an electrode and a source/drain region beside the electrode. The spacers were positioned at the sidewalls of the electrode. There was a liner between the spacers and the electrode. A NiSi layer was on the surface of the source/drain region and the top of the electrode. As a result, the spacers were removed, while the NiSi layer on the substrate was not damaged, having a good etching.

COMPARISON EXAMPLE 1

An acid solution containing phosphoric acid having a $H_3PO_4$ concentration of 79.5% in an etching tank was heated at 120° C. Fifty dummy wafers having a SiN layer deposited on the surface were placed into the acid solution containing phosphoric acid to perform a seasoning. The acid solution containing phosphoric acid did not reach a saturation point after the analysis of a dummy wafer having a NiSi film deposited on the surface. The temperature of the acid solution containing phosphoric acid was raised to 140° C. and allowed to stand for 12 hours. Thereafter, the resulting acid solution containing phosphoric acid was provided to be an etchant for removing SiN spacers on a semiconductor substrate at 140° C. The semiconductor used in the comparison example was the same as what was described in the example above. As a result, the spacers were removed; however, the NiSi layer on the substrate was damaged. A good etching result cannot be achieved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a semiconductor device, comprising:
   defining an electrode on a semiconductor substrate;
   forming a spacer on at least one sidewall of the electrode;
   performing a process operation on the semiconductor substrate using the spacer as a mask and forming a material layer on the top or the surface of the semiconductor substrate and the electrode; and
   removing the spacer by steps of:
   performing a wet etching process at a first temperature in a range of 100° C. to 150° C. to etch the spacer using an acid solution containing phosphoric acid as an etchant, wherein the acid solution containing phosphoric acid is subjected to a silicide seasoning at a second temperature to reach a saturation point before provided for the wet etching process.

2. The method of claim 1, wherein the spacer comprises silicon nitride.

3. The method of claim 1, wherein the material layer comprises nickel silicide.

4. The method of claim 1, wherein the first temperature is 140° C.

5. The method of claim 1, wherein the second temperature is in a range of 100° C. to 180°C.

6. The method of claim 1, after the seasoning, further comprising a step of making the acid solution containing phosphoric acid stand at a third temperature.

7. The method of claim 6, wherein the third temperature is the first temperature.

8. The method of claim 1, wherein the silicide seasoning is performed by dipping a silicide film in the acid solution containing phosphoric acid.

9. The method of claim 8, wherein the silicide film comprises silicon nitride.

10. A method of removing a spacer, comprising:
providing a substrate comprising an electrode, a spacer on at least one sidewall of the electrode, and a material layer on the top or the surface of the substrate and the electrode; and
performing a wet etching process at a first temperature in a range of 100° C. to 150° C. to etch the spacer using an acid solution containing phosphoric acid as an etchant, wherein the acid solution containing phosphoric acid is subjected to a silicide seasoning at a second temperature to reach a saturation point before provided for the wet etching process.

11. The method of claim 10, wherein the spacer comprises silicon nitride.

12. The method of claim 10, wherein the material layer comprises nickel silicide.

13. The method of claim 10, wherein the first temperature is 140°C.

14. The method of claim 10, wherein the second temperature is in a range of 100° C. to 180° C.

15. The method of claim 10, after the seasoning, further comprising a step of making the acid solution containing phosphoric acid stand at a third temperature.

16. The method of claim 15, wherein the third temperature is the first temperature.

17. The method of claim 10, wherein the silicide seasoning is performed by dipping a silicide film in the acid solution containing phosphoric acid.

18. The method of claim 17, wherein the silicide film comprises silicon nitride.

* * * * *